Figure 1:
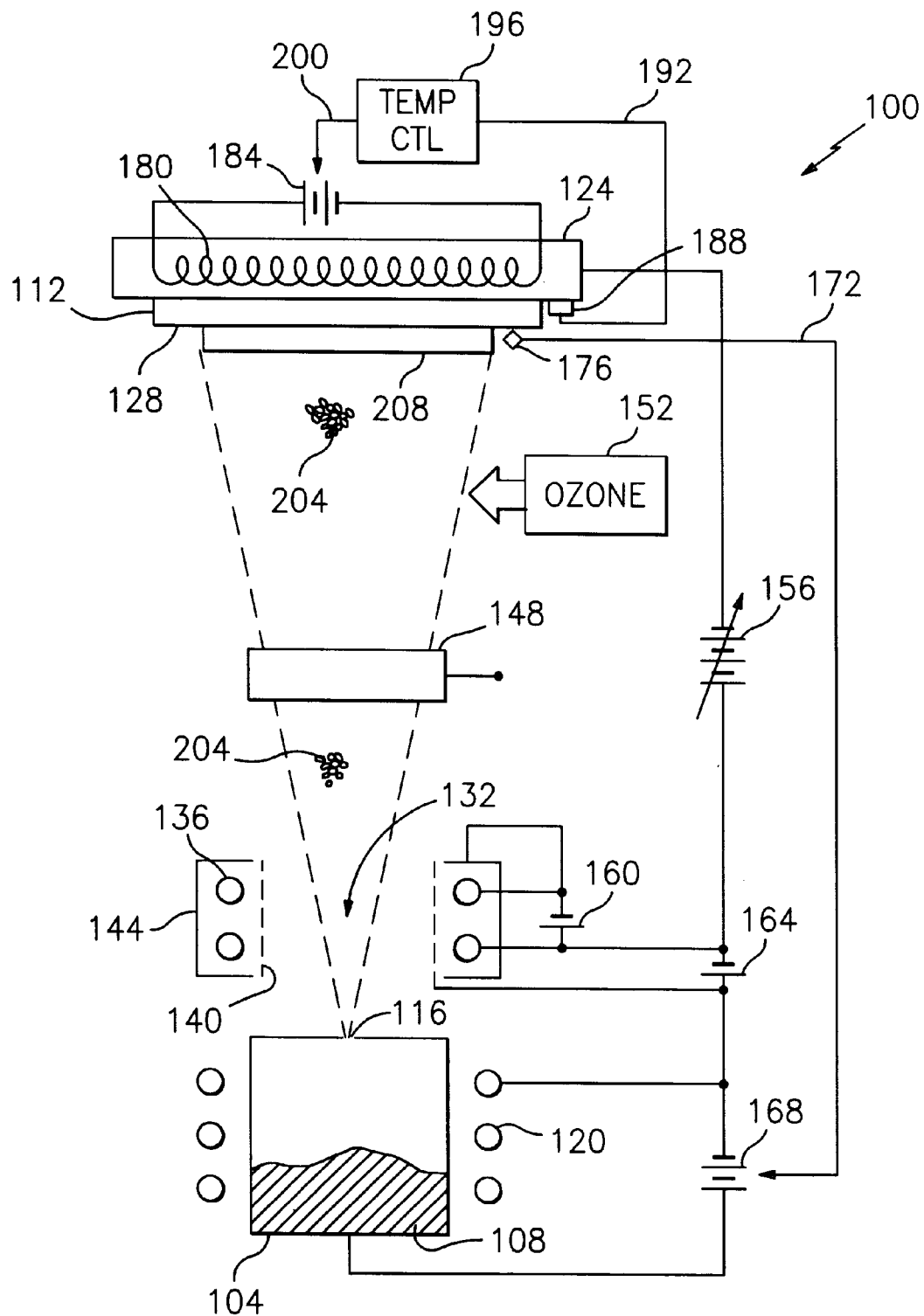

United States Patent [19]
Weaver et al.

[11] Patent Number: 6,069,078
[45] Date of Patent: May 30, 2000

[54] MULTI-LEVEL INTERCONNECT METALLIZATION TECHNIQUE

[75] Inventors: James C. Weaver, Richmond, Vt.; Rick C. Jerome, Vancouver, Wash.

[73] Assignee: UTMC Microelectronic Systems Inc., Colorado Springs, Colo.

[21] Appl. No.: 09/001,130

[22] Filed: Dec. 30, 1997

[51] Int. Cl.⁷ .................................................. H01L 21/44
[52] U.S. Cl. ........................... 438/679; 438/685; 438/688; 427/531; 427/566; 427/576; 427/597
[58] Field of Search ..................................... 438/679, 685, 438/688; 427/531, 566, 576, 597

[56] References Cited

U.S. PATENT DOCUMENTS

| | | | |
|---|---|---|---|
| 4,091,138 | 5/1978 | Takagi et al. ............................ | 428/209 |
| 4,755,438 | 7/1988 | Morimoto et al. ....................... | 428/652 |
| 4,944,961 | 7/1990 | Lu et al. .................................. | 437/38 |
| 4,954,214 | 9/1990 | Ho . | |
| 5,011,732 | 4/1991 | Takeuchi et al. ........................ | 438/209 |
| 5,091,339 | 2/1992 | Carey . | |
| 5,110,435 | 5/1992 | Haberland ........................... | 204/192.31 |
| 5,196,102 | 3/1993 | Kumar ..................................... | 427/528 |
| 5,208,170 | 5/1993 | Kobeda et al. . | |
| 5,252,382 | 10/1993 | Li . | |
| 5,344,785 | 9/1994 | Jerome et al. . | |
| 5,350,607 | 9/1994 | Tyson et al. . | |
| 5,354,712 | 10/1994 | Ho et al. . | |
| 5,380,683 | 1/1995 | Tyson et al. . | |
| 5,439,731 | 8/1995 | Li et al. . | |
| 5,466,635 | 11/1995 | Lynch et al. . | |
| 5,514,622 | 5/1996 | Bornstein et al. . | |

*Primary Examiner*—John F. Niebling
*Assistant Examiner*—David A. Zarneke
*Attorney, Agent, or Firm*—Morgan & Finnegan, LLP

[57] ABSTRACT

A method of forming metallization layers and vias as part of an interconnect structure within an integrated circuit ("IC") is disclosed. The metallization layers and vias are formed of an alloy consisting of tungsten and one or more other materials such as aluminum, gold, copper, cobalt, titanium, molybdenum or platinum. In the alternative, the alloy may include aluminum and exclude tungsten. The alloy that forms the metallization layers and vias is deposited onto the IC substrate using ionized cluster beam ("ICB") apparatus. The IC substrate is an "in-process" IC in that various active devices (e.g., bipolar and/or MOS transistors), resistors and capacitors are formed in the substrate using conventional techniques prior to the ICB deposition of the alloy layers. Intermediate IC substrate processing steps (e.g., patterning and etching to form the vias) may take place in-between ICB deposition steps.

20 Claims, 2 Drawing Sheets

MULTI-LEVEL INTERCONNECT METALLIZATION TECHNIQUE

TECHNICAL FIELD

This invention relates to the ionized cluster beam ("ICB") deposition of materials, and more particularly to the ICB deposition of a tungsten alloy in forming metallization layers and vias as part of a device interconnect structure in an integrated circuit ("IC").

BACKGROUND ART

In the art of deposition of films of material onto a surface of a substrate, there are many known techniques, including vacuum evaporation deposition, ion plating, ion- and plasma-assisted sputtering or chemical vapor deposition ("CVD"), and the more modern ICB approach. ICB deposition is an ion-assisted technique in which the material to be deposited on a substrate is heated in a crucible and its vapor ejected through a small nozzle into a vacuum region. The vapor forms loosely-held atomic clusters, each cluster comprising 100 to 2000 atoms of the material. Some of the ejected vaporized atomic material is ionized by electron bombardment and the atoms are accelerated toward the substrate disposed in the vacuum region. The ionized material, together with the neutral (i.e., non-ionized) component of the vapor, arrive at the substrate surface for deposition thereon. ICB deposition offers the ability to precisely control the deposited film structure by applying kinetic energy to the vapor clusters during film deposition. Kinetic energy control is achieved by varying the acceleration voltage and the electron current for ionization.

In most of the known ion- and plasma-assisted deposition techniques, the individual atoms of the material to be deposited on the substrate generally impact the substrate surface with excessive kinetic energy, producing a relatively high number of defects in the substrate and/or the deposited film. With ICB deposition, a more useful lateral energy is obtained as the clusters impact the substrate and the atoms break off, without damaging the film and substrate. Due to the effects of ionized cluster bombardment, ICB deposition produces films with high density, strong adhesion, a low impurity level, and a smooth surface. Also, film properties usually associated with relatively high substrate temperatures in conventional vacuum depositions can be obtained at lower substrate temperatures in the ICB technique. This results in a distinct advantage in semiconductor device fabrication. See, for example, U.S. Pat. Nos. 4,152,478, 4,217,855, 5,350,607 and 5,380,683, all of which are hereby incorporated by reference.

The trend in the semiconductor manufacturing industry has always been to increase the number of active devices (e.g., transistors, resistors, capacitors) formed in an area of a semiconductor substrate (e.g., silicon, germanium, gallium arsenide). This increase in IC density has been achieved primarily by decreasing the size of the active devices and associated electrically-isolating areas (e.g., field oxide) formed within the IC substrate. Sizes of such devices and areas are now down into the submicron range. This size reduction has been achieved largely through improved fabrication methodologies and structures.

For example, it is common to employ one or more thin horizontal layers of a high-conductivity metal (e.g., aluminum), separated by insulating layers, together with associated vertical, high-conductivity interconnecting plugs or vias routed through the insulating layers. This is to connect between the active devices in the semiconductor substrate. In this approach, holes are formed in the insulating layers at desired connection points. The holes are filled with a high-conductivity, low-resistivity material to form the vias. The overlying horizontal metallization layer is then deposited. This process is repeated for subsequent vertical plugs and horizontal overlying layers. In this way, an ohmic contact is formed between active device areas (e.g., the source and drain terminals of an MOS transistor, or the collector, base and emitter terminals of a bipolar transistor) in the silicon substrate. Interconnections can be made in the different metal layers as cross-overs, thereby further increasing IC density. This interconnect process is generally referred to as "metallization".

However, conventional metallization techniques encounter problems as device geometries become increasingly smaller. For example, as device sizes shrink, contact or via holes formed closer together, are of smaller diameter and have steeper vertical sidewalls. As a result, it has become difficult to accurately deposit conventional materials, such as aluminum, using conventional techniques (e.g., sputtering), into the holes to achieve uniform contact with device contact areas and metallization layers. Non-uniform contact within the interconnects results in problems such as non-planar topographies and electrical breaks formed at the edges of the holes. The result is manifested in relatively poor step coverage of the metallization layers and vias. Other problems include those related to the reliability of the interconnect lines, such as electromigration or wear-out failures.

Also, as device sizes shrink, connection lines become smaller, thereby subjecting the interconnects to higher current densities. At these higher densities, aluminum metallization layers and plugs are increasingly susceptible to stress migration and electromigration damage. Further, conventional metallization materials such as aluminum exhibit higher resistance, which increases the RC time constants of the device, thereby limiting overall device speed.

In an attempt to overcome these problems, it is known in the prior art to utilize tungsten as the material comprising the metallization layers and/or the plugs, or as a separate, additional barrier layer utilized in conjunction with an aluminum layer or plug. Tungsten is utilized in part because, relative to aluminum, tungsten has a higher resistance to electromigration. The tungsten barrier layer acts as a backup layer, maintaining the electrical connection integrity of the metallization layers and plugs if the primary aluminum layers and plugs fail due to stress migration and electromigration. Still further, tungsten can be deposited somewhat more uniformly than aluminum, thereby reducing the aforementioned concerns with step coverage.

However, an inherent problem with the use of tungsten alone as the material comprising the metallization layers and plugs is that tungsten has approximately three times the resistivity of aluminum. Therefore, it is desired to utilize tungsten as the primary constituent of a tungsten alloy formed as a metallization layer or plug, and to deposit the tungsten alloy layer onto a semiconductor substrate using the ICB approach.

DISCLOSURE OF INVENTION

Objects of the invention include the use of a tungsten alloy as an IC metallization layer and plug to provide increased resistance to electromigration and to provide reduced resistivity (as compared to tungsten alone) of an IC interconnect scheme. Other objects include the allowance for vertical plugs or vias to be stacked on one another, thereby improving the step coverage and increasing the density of the resulting IC.

According to the invention, an "in-progress" IC semiconductor substrate has various devices (e.g., transistors) formed therein by conventional techniques. A tungsten alloy, comprising primarily tungsten and one or more other materials such as aluminum, gold, copper, cobalt, titanium, molybdenum, or platinum, is deposited as a film or layer over the exposed semiconductor substrate surface using the ICB technique. In the alternative, the alloy that is ICB deposited may exclude tungsten and, instead, may comprise aluminum together with one or more of these other materials. On the exposed substrate surface may be formed an oxide layer with openings therein. The openings represent the ultimate locations for the plugs or vias within the substrate.

In the ICB deposition technique, a crucible containing the tungsten or aluminum alloy mixture is heated until a vapor of the alloy is formed. The vapor is ejected through a small nozzle into a vacuum region. The resulting adiabatic expansion of the vapor promotes formation of atomic clusters. Some of the clusters are ionized, and electrons are stripped off the clusters. The clusters are accelerated toward the substrate, which is also within the vacuum region. The clusters impact the surface of the substrate, where they are deposited to form the alloy layer. The deposited alloy layer is then patterned and etched to form the desired vertical plugs and horizontal metallization layer contacts. A subsequent oxide insulating layer may be formed on top of the ICB deposited alloy layer, and an additional ICB deposited layer of a tungsten or aluminum alloy may be deposited on the oxide layer and subsequently patterned and etched. This process may be repeated as desired, to form the overall metallization structure for the IC.

The above and other objects and advantages of this invention will become more readily apparent when the following description is read in conjunction with the accompanying drawings.

BREIF DESCRIPTION OF DRAWINGS

Figure 2:
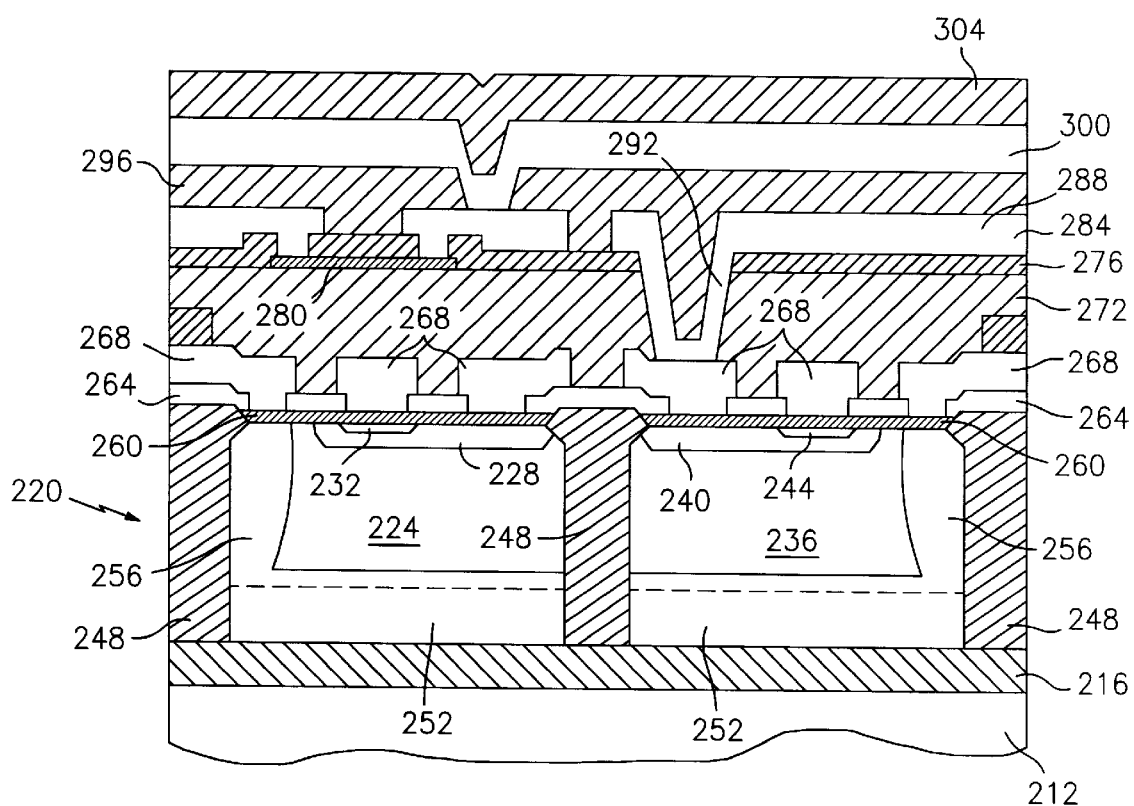

FIG. 1 is a schematic illustration of ICB apparatus for depositing layers of a tungsten or aluminum alloy that is subsequently patterned to form metallization and vias, in accordance with the method of the present invention; and FIG. 2 is a cross-sectional illustration of a portion of an "in progress" silicon substrate having active transistor devices formed therein along with the deposited alloy metallization layers and vias according to the method of the present invention.

BEST MODE FOR CARRYING OUT THE INVENTION

Referring to FIG. 1, the known ICB material deposition apparatus 100 illustrated therein is available from, e.g., Mitsubishi Corporation, Itami Works, Hyogo, Japan. The basic operating principles of the ICB apparatus 100 follow. Clusters of atomic material to be deposited on a substrate are formed by adiabatic expansion of material vapor passing through a nozzle. The clusters are then ionized by impact ionization using electrons of an appropriate energy. Cluster sizes distribute in a range of, e.g., 100 to 2000 atoms per cluster. The clusters bombard the substrate surface, and both ionized and neutral clusters are broken up and redistributed due to the high surface mobility of the loosely-held clusters. The scattered atoms may move over the substrate surface with such surface diffusion energy before they are physically attracted to the substrate surface. Such attraction is due to high kinetic energy parallel to the surface caused by conversion from the incident kinetic energy. The crystallographic structure and physical properties of thin films deposited using the ICB apparatus 100 are found to be strongly dependent upon the energy of the ionized material. This energy is controlled by the acceleration voltage during film deposition and, to a lesser extent, by substrate temperature.

The method of depositing a tungsten or aluminum alloy layer onto a surface of a silicon substrate having transistors formed therein, to subsequently form metallization layers and vias, in accordance with a preferred exemplary embodiment of the present invention, is described hereinafter with reference to the figures, with particular reference initially to FIG. 1. The ICB apparatus 100 includes a crucible 104 containing the alloy source material 108 to be deposited onto a surface of a silicon substrate 112. The various contemplated compositions of the source material 108 are described in detail hereinafter. The crucible 104 may comprise, e.g., relatively inexpensive but purified graphite. The crucible 104 may contain the source material 108 in any physical form; for example, an element mixture in solid form. The physical form of the source material 108 in the crucible 104 is irrelevant, since the material is heated to a vapor state.

The crucible 104 has at least one small diameter ejection nozzle 116, along with heating elements 120, e.g., filaments, disposed adjacent the crucible walls. The filaments 120 heat the crucible by emitting electrons which impact the crucible. However, crucible heating may occur through other methods. One is radiation heating where heat is generated by a crucible heating filament. Another is resistance heating using electrons emitted from filaments located within the crucible walls. In this method, electrical current is flowed directly through the outer surface of the crucible. The method chosen for heating the crucible 104 is irrelevant to the present invention.

A substrate holder 124 comprises an electrically-conductive material. As described in detail hereinafter, a surface 128 of the substrate 112 has the alloy source material 108 deposited thereon by the ICB apparatus 100 in accordance with the present invention.

Disposed above and in proximity to the ejection nozzle 116 is an ionization chamber 132. The chamber 132 has one or more filaments 136 for emitting electrons. The chamber 132 also has acceleration electrodes 140 for accelerating the emitted electrons, and a shield 144 for preventing undesirable scattering of the electrons. Disposed above the chamber 132 is a shutter 148, which selectively prevents the alloy vapor ejected from the crucible 104 from impinging onto the substrate surface 128.

All of the aforementioned components of the ICB machine 100 are disposed within a vacuum region or chamber having a pressure of preferably $1.33 \times 10^{-3}$ Pascals ("Pa") or less. An ozone source 152 may be provided for injecting a flow rate of ozone into the vacuum chamber.

A variable power supply 156 is connected between the substrate holder 124 and the ionization chamber 132. The supply 156 maintains the substrate holder at a relatively high negative potential with respect to the chamber. The electric field imparts kinetic energy to the positively ionized alloy clusters for their accelerated movement toward the substrate surface 128. A second power supply 160 is connected across the filaments 136 in the chamber 132. The supply 160 energizes the filaments 136, causing them to emit electrons.

A third power supply 164 is connected between the filaments 136 and acceleration electrodes 140. The supply 164 keeps the acceleration electrodes 140 at a highly positive potential with respect to the filaments 136. This potential accelerates the electrons emitted from the filaments 136 and ionizes some of the alloy clusters in the ionization chamber 132. This third power supply 164 thus provides an ionization current.

A fourth power supply 168 energizes the crucible filaments 120. The filaments 120 emit electrons which impact and, thus, heat the crucible 104. The supply 168 may be controlled by a signal on a line 172 provided by a quartz crystal 176. The crystal 176, which vibrates at a measurable frequency, is disposed in close proximity to the substrate 112. As more of the alloy source material 108 is deposited onto the substrate surface 128, the vibration frequency of the crystal 176 decreases. Since the change in the vibration frequency is related to the deposition rate, the crystal provides a simple method of monitoring the deposition rate of the alloy 108 onto the substrate surface 128. The supply 168 is responsive to the signal on the line 172 to vary the temperature of the crucible 104. For example, as the alloy deposition rate decreases, the crucible may be heated to increase the deposition rate.

The substrate holder 124 contains a coil 180 for heating the substrate 112 to a temperature which facilitates deposition of the alloy 108 onto the substrate 112. A power supply 184 powers the coil in the substrate holder 124. A thermocouple 188 attached to the substrate provides a signal on a line 192 indicative of the temperature of the substrate 112. The signal is fed to a circuit 196 which compares the actual substrate temperature on the line 192 with a desired substrate temperature provided by an operator of the ICB apparatus 100. Any difference therebetween is provided on a signal line 200 to control the power supply 184.

In light of the foregoing description of the ICB machine 100, a description of the method of the present invention for depositing the alloy 108 onto a substrate 112 to form metallization layers and vias follows. Still referring to FIG. 1, the starting material 108 is loaded into the crucible 104. The substrate 112 is loaded into the substrate holder 124. The crucible heating filaments 120 and the substrate heater 180 are energized by the corresponding power supplies 168,184. As the crucible 104 heats up, the alloy 108 therewithin becomes a vapor.

The filaments 120 heat the crucible 104 to a desired temperature. The crucible temperature is regulated so that the pressures of the vapor in the crucible may exceed at least 100 times the pressure outside the crucible in the vacuum region. The greater the difference between the internal and external pressures of the crucible, the greater the ejection velocity of the vaporized material exiting the crucible.

The shutter 148 is opened to allow the tungsten alloy material ejected from the nozzle 116 of the crucible 104 to travel toward the substrate 112. The substrate heater 180 heats the substrate to a temperature of 300 to 700 degrees C. The acceleration power supply 156 is initially set between 50 electron volts ("eV") and 5 thousand electron volts ("keV"). The ionization current power supply 164 is adjusted to provide an ionization current of 200 to 300 milliamps ("mA"). The ozone source 152 is adjusted to provide an oxygen partial pressure within the high vacuum region in the range of $6.66 \times 10^3$ Pa to $13.33 \times 10^{-3}$ Pa.

The alloy vapor in the crucible 104 is ejected into the vacuum region where it is supercooled due to adiabatic expansion. As a result, the alloy vapor forms atomic groups or clusters 204, each cluster 204 typically comprising approximately 100 to 2000 atoms loosely bonded together by van der Waals attractive forces.

Through kinetic energy imparted to the alloy when ejected through the nozzle 116, the alloy clusters 204 enter the ionization chamber 132. There, the clusters 204 are bombarded by electrons emitted from the filaments 136. The electron bombardment ionizes at least one atom within some of the clusters 204, thus forming partially ionized clusters 204. The ionization current is controlled by the ionization power supply 164. Other clusters 204 are not ionized and, thus, remain neutral.

The acceleration power supply 156 imparts kinetic energy to the ionized clusters 204 to move and accelerate them toward the substrate 112. The energies imparted to the ionized clusters are controlled through variation of the acceleration power supply 156. The neutral clusters 204 also move toward the substrate 112 by the action of the kinetic energy received by the clusters when ejected from the crucible nozzle 116. When the clusters 204 reach the substrate surface 128, both types of clusters impinge on the surface, forming thereon a high quality film 208 of the alloy.

When the ionized clusters 204 collide with the substrate 112, most of the kinetic energy of the clusters is converted into thermal energy. This energy is imparted to the surface layer 208 of alloy 108 being deposited on the substrate surface 128. At the same time, each ionized cluster 204 itself is disintegrated into individual atomic particles, which move onto the deposited surface layer 208 to facilitate the growth of the alloy due to the migration effects. Such effects can also be expected in the case of the neutral or non-ionized clusters 204. The migration effects are created at an elevated temperature caused by the thermal energy converted from the kinetic energy of the clusters and imparted to the deposited surface layer 208. An exemplary thickness of the deposited alloy layer 208 is preferably between 5000–20,000 Angstroms. Once the alloy layer 208 has been formed, the shutter 148 is closed, all power supplies are turned off, and the resulting substrate 112 is allowed to cool before being removed from the ICB apparatus 100.

FIG. 2 is a cross-sectional diagram of the substrate 112 at various steps in the method of utilizing the ICB apparatus 100 of FIG. 1 to deposit the alloy 108 onto the surface 128 of the substrate to form one or more metallization layers and vias, according to the present invention FIG. 2 is somewhat similar to FIG. 16 of U.S. Pat. No. 5,344,785 ("the '785 patent"), which is owned by the common assignee herewith and which is hereby incorporated by reference. The '785 patent describes and illustrates a method of manufacturing various types of silicon devices, such as complementary bipolar PNP and NPN transistors, in a silicon-on-insulator ("SOI") IC. Vertical bipolar transistors are formed in a silicon device layer, such that each transistor is fully isolated from one another and from other similarly manufactured silicon devices in the silicon device layer.

Attention is drawn to the '785 patent for a detailed description of the method of forming the vertical bipolar transistors, together with the resulting transistor structure. However, it is to be understood that FIG. 2 herein merely represents one exemplary embodiment of the metallization and vias that result from the ICB deposition method of the present invention. Instead, the ICB deposition of the alloy may be carried out for use with other integrated circuit structures, in light of the teachings herein. For example, the ICB deposition may be utilized to for metallization layers and vias for MOS and bipolar transistors formed in any semiconductor substrate, such as silicon, germanium or gallium arsenide.

FIG. 2 herein illustrates a silicon substrate 212 having an overlying insulating layer 216 over which is disposed a silicon device layer, denoted generally by the reference numeral 220. Note that the reference numbers appended to FIG. 2 herein differ from those appended to like elements in FIG. 16 of the '785 patent. The silicon device layer 220 has a pair of vertical transistors formed therein. A PNP transistor has a collector 224, a base 228 and an emitter 232, while an NPN transistor has a collector 236, a base 240 and an emitter 244. The transistors are separated by vertical oxide insulating trenches 248. Each transistor also has a buried layer 252 and a sink 256.

Thin oxide layers regions 260 are disposed over the active device regions of the transistors. A thicker oxide layer 264 is formed and patterned on top of the active device regions. The patterned oxide layer 264 is used to isolate the doped polysilicon contacts 268, which are in electrical contact with the active device regions of the transistors. Above the polysilicon contacts is formed a relatively thick oxide layer 272, followed by a thinner low temperature oxidation ("LTO") oxide layer 276. A thin film resistor 280 may be formed.

The oxide layers 272,276 may then be etched to expose the polysilicon contact 268 for the base terminal region 240 of the NPN transistor, and to expose contacts to the thin film resistor 280. At this point in the processing of the substrate of FIG. 2, the substrate may be placed within the ICB apparatus of FIG. 1, and a layer of the alloy may be deposited onto the exposed substrate surface in the manner discussed hereinbefore. This forms a layer 284 comprising a substantially horizontal metallization layer 288 together with a vertical contact, plug or via 292. As shown, the via 292 has sloping vertical sidewalls.

In accordance with the present invention, the alloy 108 to be deposited onto the semiconductor substrate 212 preferably comprises either tungsten or aluminum. Tungsten is preferred because, relative to aluminum, tungsten has a higher resistance to electromigration. However, because tungsten inherently has a high resistance, the present invention contemplates the addition to the tungsten of any one or more of the following low-resistivity, high-conductivity materials: aluminum, gold, copper, cobalt, titanium, molybdenum and platinum. The addition of low resistivity materials to tungsten reduces the RC time delay of the resulting metallization layers and vias. Further, the present invention contemplates that tungsten may comprise any percentage of the resulting alloy. For example, tungsten may comprise from ten to ninety percent of the alloy, with one or more of the additional elements mentioned above comprising the remaining alloy portion. The choice of materials comprising the tungsten alloy, together with their associated percentages in the alloy, should be apparent to one of ordinary skill in the art and will likely be selected based upon the desired resistivity and other electrical and physical characteristics of the resulting metallization layers and vias.

Further, the present invention contemplates the ICB deposition of an alloy not comprising tungsten, but, instead, comprising aluminum, together with any one or more of the aforementioned elements. The percentage composition of the resulting aluminum-based alloy may assume the wide range as for the tungsten alloy discussed above.

After the tungsten or aluminum alloy layer 284 has been deposited using the ICB apparatus 100 of FIG. 1, the substrate is removed from the ICB machine, and the layer 284 is patterned and etched at various locations. Another oxide layer 296 is then deposited, patterned and etched to form selected openings. Next, the ICB apparatus 100 may be utilized to deposit a second layer 300 of tungsten or aluminum alloy on top of the oxide layer 296 in the selected openings. Similar to the first alloy layer 284, the second alloy layer 300 forms a horizontal metallization layer and vertical vias. Finally, FIG. 2 illustrates a top oxide layer 304.

As mentioned hereinbefore, FIG. 2 herein is substantially similar to FIG. 16 of U.S. Pat. No. 5,344,785. That patent discusses the use of aluminum as comprising the metallization layer. It further discusses the need for a barrier layer, comprising ten percent titanium and ninety percent tungsten, deposited under the first aluminum metallization layer. The barrier layer prevents the undesired migration of aluminum into the underlying polysilicon. In contrast, the ICB deposition of a tungsten alloy layer as the metallization layers and vias does not require the use of an additional barrier layer, thereby simplifying the IC fabrication process somewhat. However, a barrier layer could still be used, especially if gold or copper is a constituent of the alloy. Gold and copper are excellent low-resistivity materials. However, they are highly mobile elements that could contaminate the silicon substrate. The barrier layer is used to prevent such particle migration.

The ICB deposition method of the present invention allows the resulting plugs or vias to be formed through interlevel dielectric material to achieve 100% step coverage. This complete step coverage reduces or even eliminates electromigration concerns. The vias can therefore be etched vertically to allow for improved packing density, and to allow the vias to be stacked on one another. It also allows for the full planarization of the oxide interlevel dielectric or insulating layers.

It should be understood by those skilled in the art that obvious structural modifications can be made, in light of the teachings herein, without departing from the scope of the invention. Accordingly, reference should be made primarily to the accompanying claims, rather than the foregoing specification, to determine the scope of the invention.

Having thus described the invention, what is claimed is:

1. A method of forming an interconnect between at least two regions within a substrate, the method comprising the steps of:

forming the at least two regions within the substrate; and ionized cluster beam depositing a first layer of a first alloy material on a surface of the substrate to connect together the at least two regions within the substrate, wherein the first alloy material comprises tungsten and at least one other material such as aluminum, gold, copper, cobalt, titanium, molybdenum and platinum.

2. The method of claim 1, wherein the first alloy material comprises tungsten in an amount that ranges from ten percent to ninety percent of the first alloy material.

3. The method of claim 1, wherein after the step of ionized cluster beam depositing the first layer of a first alloy material on a surface of the substrate, further comprising the steps of:

depositing an insulating layer on a surface of the first layer of a first alloy material; and ionized cluster beam depositing a second layer of a second alloy material on a surface of the insulating layer.

4. The method of claim 3, wherein the second alloy material comprises tungsten and at least one other material such as aluminum, gold, copper, cobalt, titanium, molybdenum and platinum.

5. The method of claim 4, wherein the second alloy material comprises tungsten in an amount that ranges from ten percent to ninety percent of the second alloy material.

6. The method of claim 3, wherein the second alloy material comprises aluminum and at least one other material such as gold, copper, cobalt, titanium, molybdenum and platinum.

7. The method of claim 6, wherein the second alloy material comprises aluminum in an amount that ranges from ten percent to ninety percent of the second alloy material.

8. The method of claim 3, wherein after the step of depositing an insulating layer on a surface of the first layer of a first alloy material, further comprising the step of selectively removing at least one portion of the insulating layer.

9. The method of claim 8, wherein the step of selectively removing the at least one portion of the insulating layer further comprises the steps of:
    patterning the insulating layer; and
    etching away the at least one portion of the insulating layer to selectively remove the at least one portion of the insulating layer.

10. The method of claim 1, wherein the step of ionized cluster beam depositing the first layer of a first alloy material on a surface of the substrate comprises the steps of:
    providing the first alloy material in a crucible having a nozzle;
    heating the crucible to a desired temperature to cause the first alloy material therein to be vaporized at a predetermined vapor pressure within the crucible, the crucible vapor pressure being greater in magnitude than a predetermined pressure value of a vacuum region external to the crucible, thereby causing the vapor to be ejected through the nozzle and into the vacuum region and forming clusters of atoms of the first alloy material by adiabatic expansion, the first alloy material clusters being formed in the vacuum region outside of the crucible in the vicinity of the nozzle;
    bombarding the first alloy material clusters with electrons, thereby resulting in at least one of the first alloy material clusters being partially ionized along with any remaining first alloy material clusters remaining non-ionized; and
    accelerating both the ionized and non-ionized first alloy material clusters toward the surface of the substrate thereby forming the first layer of the first alloy material on the surface of the substrate.

11. The method of claim 3, wherein the step of ionized cluster beam depositing the second layer of a second alloy material on a surface of the insulating layer comprises the steps of:
    providing the second alloy material in a crucible having a nozzle;
    heating the crucible to a desired temperature to cause the second alloy material therein to be vaporized at a predetermined vapor pressure within the crucible, the crucible vapor pressure being greater in magnitude than a predetermined pressure value of a vacuum region external to the crucible, thereby causing the vapor to be ejected through the nozzle and into the vacuum region and forming clusters of atoms of the second alloy material by adiabatic expansion, the second alloy material clusters being formed in the vacuum region outside of the crucible in the vicinity of the nozzle;
    bombarding the second alloy material clusters with electrons, thereby resulting in at least one of the second alloy material clusters being partially ionized along with any remaining second alloy material clusters remaining non-ionized; and
    accelerating both the ionized and non-ionized second alloy material clusters toward the surface of the insulating layer thereby forming the second layer of the second alloy material on the surface of the insulating layer.

12. A method of forming an interconnect between at least two regions within a substrate, the method comprising the steps of:
    forming the at least two regions within the substrate; and
    ionized cluster beam depositing a first layer of a first alloy material on a surface of the substrate to connect together the at least two regions within the substrate, wherein the first alloy material comprises aluminum and at least one other material such as gold, copper, cobalt, titanium, molybdenum and platinum.

13. The method of claim 12, wherein the first alloy material comprises aluminum in an amount that ranges from ten percent to ninety percent of the first alloy material.

14. The method of claim 12 wherein after the step of ionized cluster beam depositing the first layer of a first alloy material on a surface of the substrate, further comprising the steps of:
    depositing an insulating layer on a surface of the first layer of a first alloy material; and
    ionized cluster beam depositing a second layer of a second alloy material on a surface of the insulating layer.

15. The method of claim 14, wherein the second alloy material comprises tungsten and at least one other material such as aluminum, gold, copper, cobalt, titanium, molybdenum and platinum.

16. The method of claim 15, wherein the second alloy material comprises tungsten in an amount that ranges from ten percent to ninety percent of the second alloy material.

17. The method of claim 14, wherein the second alloy material comprises aluminum and at least one other material such as gold, copper, cobalt, titanium, molybdenum and platinum.

18. The method of claim 17, wherein the second alloy material comprises aluminum in an amount that ranges from ten percent to ninety percent of the second alloy material.

19. The method of claim 12, wherein the step of ionized cluster beam depositing the first layer of a first alloy material on a surface of the substrate comprises the steps of:
    providing the first alloy material in a crucible having a nozzle;
    heating the crucible to a desired temperature to cause the first alloy material therein to be vaporized at a predetermined vapor pressure within the crucible, the crucible vapor pressure being greater in magnitude than a predetermined pressure value of a vacuum region external to the crucible, thereby causing the vapor to be ejected through the nozzle and into the vacuum region and forming clusters of atoms of the first alloy material by adiabatic expansion, the first alloy material clusters being formed in the vacuum region outside of the crucible in the vicinity of the nozzle;
    bombarding the first alloy material clusters with electrons, thereby resulting in at least one of the first alloy material clusters being partially ionized along with any remaining first alloy material clusters remaining non-ionized; and
    accelerating both the ionized and non-ionized first alloy material clusters toward the surface of the substrate thereby forming the first layer of the first alloy material on the surface of the substrate.

20. The met hod of claim 14, wherein the step of ionized cluster beam depositing the second layer of a second alloy material on a surface of the insulating layer comprises the steps of:
    providing the second alloy material in a crucible having a nozzle;

heating the crucible to a desired temperature to cause the second alloy material therein to be vaporized at a predetermined vapor pressure within the crucible, the crucible vapor pressure being greater in magnitude than a predetermined pressure value of a vacuum region external to the crucible; thereby causing the vapor to be ejected through the nozzle and into the vacuum region and forming clusters of atoms of the second alloy material by adiabatic expansion, the second alloy material clusters being formed in the vacuum region outside of the crucible in the vicinity of the nozzle;

bombarding the second alloy material clusters with electrons, thereby resulting in at least one of the second alloy material clusters being partially ionized along with any remaining second alloy material clusters remaining non-ionized; and accelerating both the ionized and non-ionized second alloy material clusters toward the surface of the insulating layer thereby forming the second layer of the second alloy material on the surface of the insulating layer.

* * * * *